United States Patent [19]

Dutt

[11] 4,427,464
[45] Jan. 24, 1984

[54] LIQUID PHASE EPITAXY

[75] Inventor: Bulusu V. Dutt, Parsippany, N.J.

[73] Assignee: Bell Telephone Laboratories, Incorporated, Murray Hill, N.J.

[21] Appl. No.: 336,292

[22] Filed: Dec. 31, 1981

[51] Int. Cl.³ .......................................... H01L 21/208
[52] U.S. Cl. .................................... 148/171; 148/172; 118/421; 156/622
[58] Field of Search ....................... 148/171, 172, 173; 118/421; 156/622

[56] References Cited

U.S. PATENT DOCUMENTS

| | | | |
|---|---|---|---|
| Re. 28,140 | 8/1974 | Bergh et al. | 148/171 X |
| 3,767,481 | 10/1973 | Ettenberg et al. | 148/171 |
| 3,853,643 | 12/1974 | Verleur | 148/171 |
| 3,940,296 | 2/1976 | van Oirschot et al. | 148/171 |
| 4,028,148 | 6/1977 | Horikoshi | 148/171 |
| 4,063,972 | 12/1977 | Akai et al. | 148/171 |
| 4,088,514 | 5/1978 | Hara et al. | 148/171 |
| 4,149,914 | 4/1979 | Weyrich et al. | 148/171 |
| 4,160,682 | 7/1979 | Esseluhn | 148/171 |
| 4,227,962 | 10/1980 | Antypas | 148/171 X |
| 4,338,877 | 7/1982 | Yamanaka et al. | 118/421 |

FOREIGN PATENT DOCUMENTS

| | | | |
|---|---|---|---|
| 55-21152 | 2/1980 | Japan | 148/171 |
| 2035686 | 6/1980 | United Kingdom | 148/171 |

*Primary Examiner*—G. Ozaki
*Attorney, Agent, or Firm*—H. W. Lockhart; Michael J. Urbano; Peter A. Businger

[57] ABSTRACT

A method of liquid phase epitaxy is disclosed for growing a plurality of different layers on each of a plurality of semiconductor wafers during a single heating cycle. Each of a series of melts, each corresponding to a layer to be grown, is divided, in succession, into aliquant portions and a remainder portion. Each aliquant portion is contacted by one or more wafers, and epitaxial growth occurs as the temperature is lowered. Provision of a remainder portion enables a two-phase melt, and a wafer contacts only one distinct melt at a time.

After a growth step, the next successive melt likewise is separated into aliquant portions and a remainder portion, the wafers are removed from the preceding melt chambers and placed in contact with the newly formed aliquant portions, and growth of another layer ensues from another drop in temperature. The process is repeated for each melt provided.

Apparatus for carrying out the method also is described.

7 Claims, 4 Drawing Figures

LIQUID PHASE EPITAXY

BACKGROUND OF THE INVENTION

This invention relates to liquid phase epitaxy of compound semiconductor material. More particularly, it relates to growth of a plurality of different epitaxial layers on a plurality of semiconductor wafers in a single temperature cycle.

Liquid phase epitaxial growth for the fabrication of devices useful in optical communications and other applications is well known. Techniques are available, as disclosed in U.S. Pat. No. 3,853,643 to H. W. Verleur for liquid phase growth of a single epitaxial layer on a plurality of wafers in a single heating cycle. It is also known to grow a succession of different epitaxial layers on a single wafer. Such a procedure is shown in U.S. Pat. No. 4,028,128 to Y. Horikoshi.

In connection with processes of liquid phase epitaxial growth, the use of a predetermined two-phase melt assures that the nutrient solution has the identical degree of saturation desired for the growth of a particular layer at a predetermined growth temperature. Use of a two-phase melt involves the presence of some solids in the nutrient solution to assure excess saturating sources of certain constituents. It is significant that when one layer of a multiple-layered structure is being deposited in a predetermined growth cycle, and the rest of the melts undergo cooling, this two-phase system assures maintenance of the same degree of saturation as each of the subsequent layers is deposited. Because of this, it is important that during the growth process the melt be continuous; that is, that those portions of the melt at the growth faces be in contact with and a part of the portion of the melt containing the saturating solids in order to maintain the same saturation conditions for growth. It is important also to maintain the separation of the several melts without intermixing to assure the desired composition of the individual layers.

Accordingly, an object of the invention is multi-slice, multi-layer liquid phase epitaxy process which enables fabrication of semiconductor devices on a batch basis having a plurality of layers in a single heating cycle.

SUMMARY OF THE INVENTION

In the inventive method, a series of nutrient solutions or melts, each corresponding to a layer, is prepared. Each melt then, in succession, is divided into aliquant portions and a remainder. Advantageously, using vertically interleaved sliders, a plurality of semiconductor wafers is placed in contact with the aliquant portions of the first melt. The first layer is grown at the specified temperature, after which the second melt is similarly and separately divided. The wafers then are removed from all contact with the first melt and placed in contact with the aliquant portions of the second melt, and the second layer then is grown at a lower temperature.

This sequence is continued for as many melts and layers as are provided. During each growth step, the aliquant portions remain in contact or connection with the remainder portion wherein there may be contained solids, thus enabling the use and advantages of a two-phase system. Each melt remains distinct and separate throughout the process, and each wafer is subjected to only one distinct melt of controlled composition at a time.

Apparatus for advantageously accomplishing the inventive method comprises a boat assembly, typically of graphite having an upper tier comprising a series of melt chambers and a lower tier comprised of vertically disposed interleaved slider plates. One set of plates defines a series of thin vertically disposed melt chambers, and an interposed set of plates has a pair of recesses, one on each face, for mounting the wafers. A horizontally disposed shutter plate having a row of ports therein is slidably positioned between the upper and lower tiers for admitting each melt in sequence from the upper tier melt chambers to the lower vertical aliquant sections.

Thus, it is a feature of the invention that the melts which are the sources of the grown layers are maintained homogenized as two-phase melts and are divided sequentially into aliquant and remainder portions.

Another feature is that the aliquant portions and the remainder portion are in constant contact throughout the growth step in order to preserve the same degree of saturation.

BRIEF DESCRIPTION OF THE DRAWINGS

The invention and its further objects and features will be more clearly understood from the following detailed description taken in conjunction with the drawings which depict apparatus for carrying out the method in accordance with the invention. More specifically, in the drawings.

DETAILED DESCRIPTION

Figure 1:
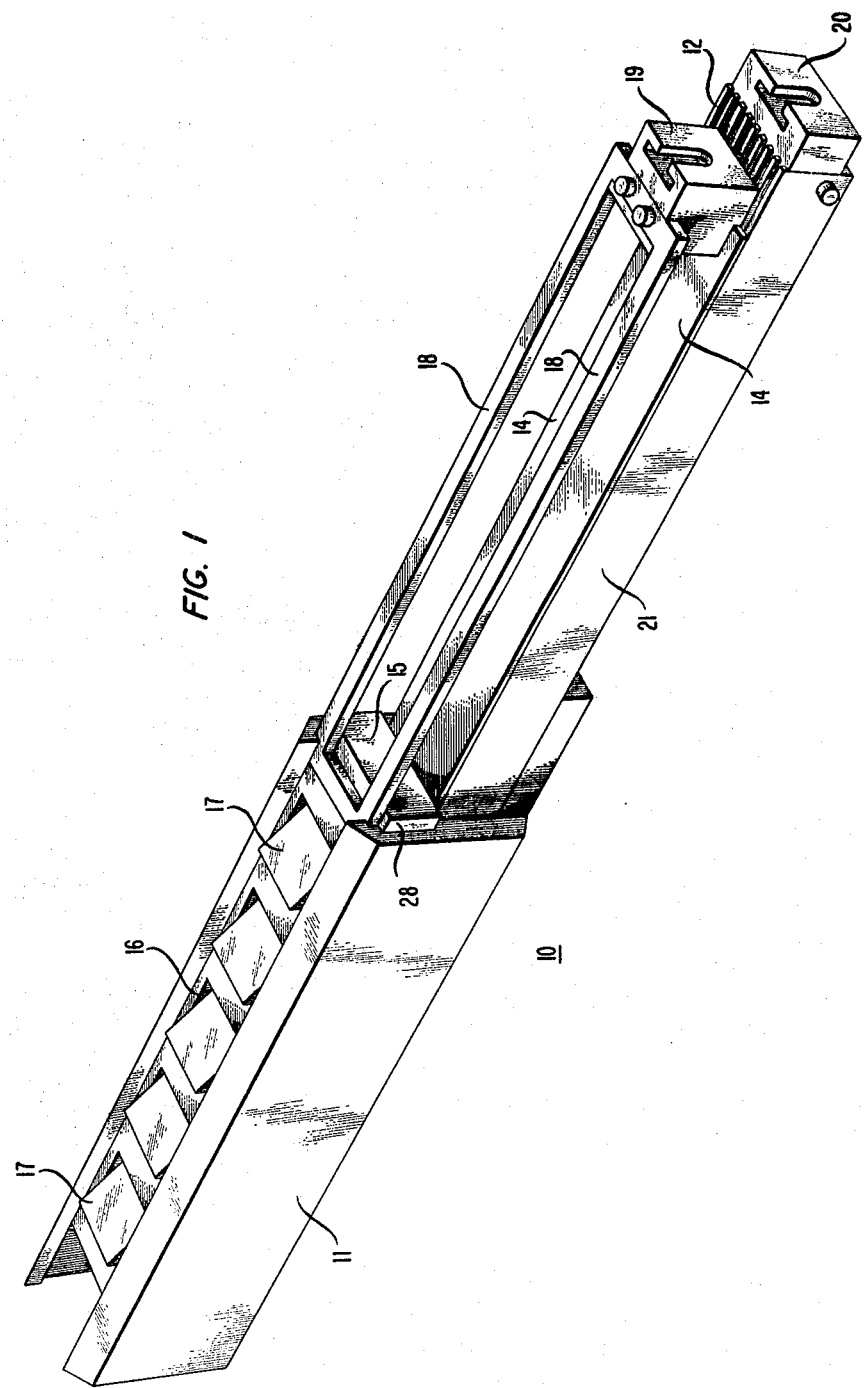
FIG. 1 is a perspective view of a multi-slice, multi-layer boat suitable for practicing the method in accordance with the invention.

The method in accordance with the invention will be described in terms of an apparatus as depicted in the drawings which enables advantageous practice of the method. Referrings to FIGS. 1 and 2 particularly, the multi-slice, multi-layer boat 10 comprises a frame member 11 which constitutes a support or housing for the other elements of the boat. Typically, the entire apparatus is fabricated from a nonreactive high-temperature resistant material such as graphite. Within the frame member 11 are two tiers of movable and stationary elements.

Figure 2:
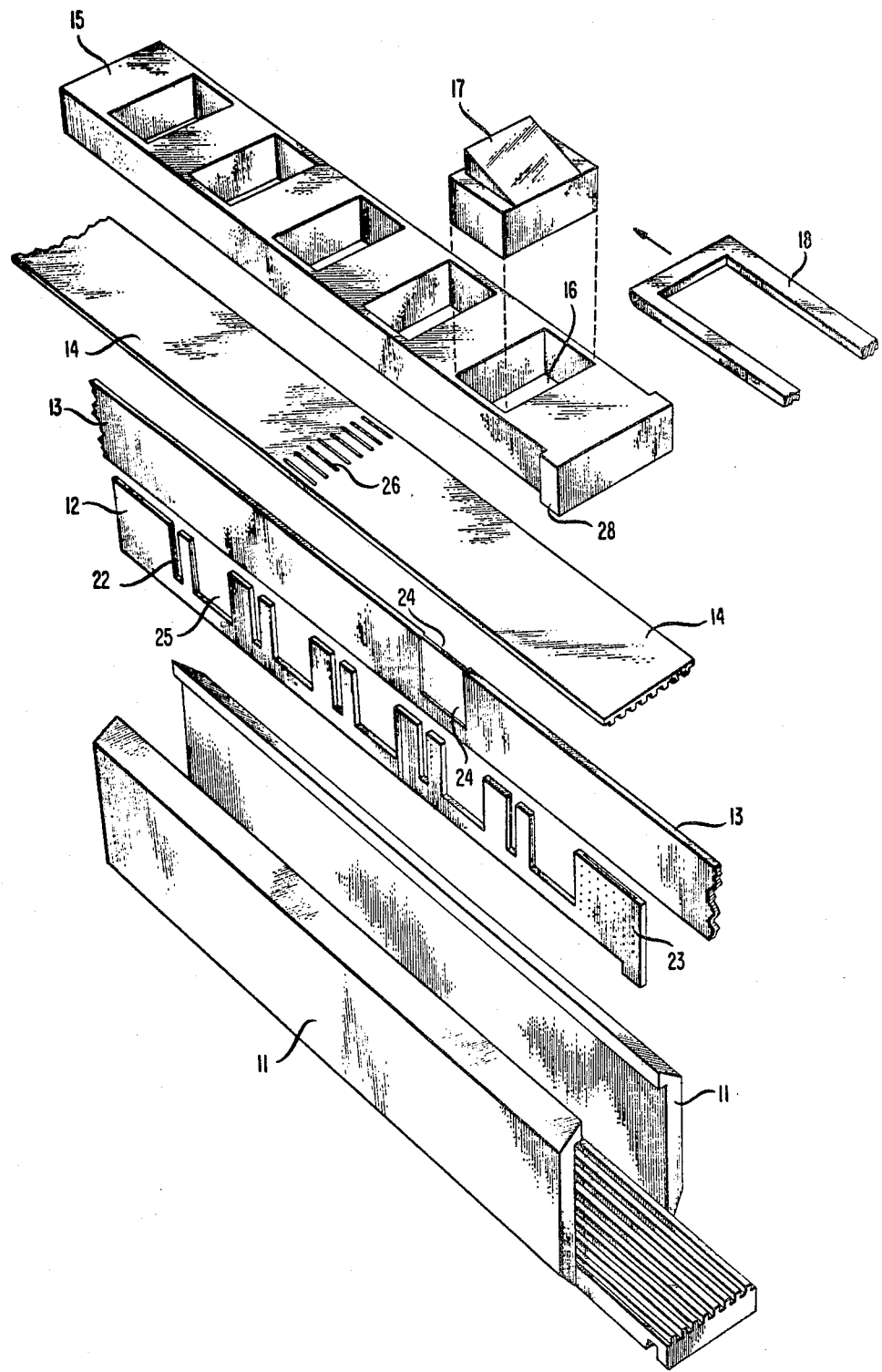
FIG. 2 is a perspective view partially in section showing separate members of the boat shown in FIG. 1.

The lower tier comprises a series of interleaved plates which are vertically disposed. One set of stationary melt plates 12 has cutout portions 25 which form melt wells in the lower tier. In between the melt wells 25 are small cutout portions which form wiping wells 22. The melt plates 12 are interleaved with wafer slider plates 13, each of which has a pair of recesses 24 on opposite faces of the plate. The recesses 24 each are designed to hold one semiconductor wafer during the growth process. As depicted in FIG. 2 only one wafer slider plate 13 and one melt plate 12 are shown in the interest of clarity of the Figure. Similarly, in FIG. 3 and 4, the full number of melt plates 12 and wafer slider plates 13 are not drawn; rather, a partial section is presented to give a detailed view of the melt wells 25, wafer slider plates 13 and melt plates 12.

In the array of interleaved wafer slider plates 13, the enclosing end sliders 21 carry only a single wafer in the recess 24 on the inside wall. Thus, an array of seven intermediate slider plates and two end sliders provides a capacity of sixteen wafers. The melt plates 12 are mounted in fixed relation to the frame member 11, while the wafer slider plates 13 are pinned together and moved as a unit by the slider pusher 20.

A shutter plate 14 is slidably mounted on top of the interleaved vertical melt plates 12 and wafer slider 13. The shutter plate 14 advantageously may have lands and grooves on its underface which mate appropriately with the interleaved slider and melt plates. The shutter plate 14 has an array of ports 26 which registers with the melt wells 25 formed thereunder by the melt plates 12. The shutter plate is moved by a shutter pusher 19, to which also is affixed a push rod 18.

Comprising the upper tier is a melt chamber member 15 which is slidably mounted to form the upper tier of the boat. The melt chamber member 15 includes a series of melt chambers 16, each of which is adapted for holding a different growth solution. Each melt chamber 16 has arranged therein a pressure element or piston 17. The push rod 18 provides means which, by engaging the inclined surface of the piston, forces each piston downward in succession as the push rod and shutter pusher 19 are advanced during the process. The melt chamber member 15 is precluded from sliding within the upper tier beyond a position of registration between the melt chambers and the corresponding melt wells 25 in the lower tier by providing a stop in the form of enlarged header member 28.

Figure 3:
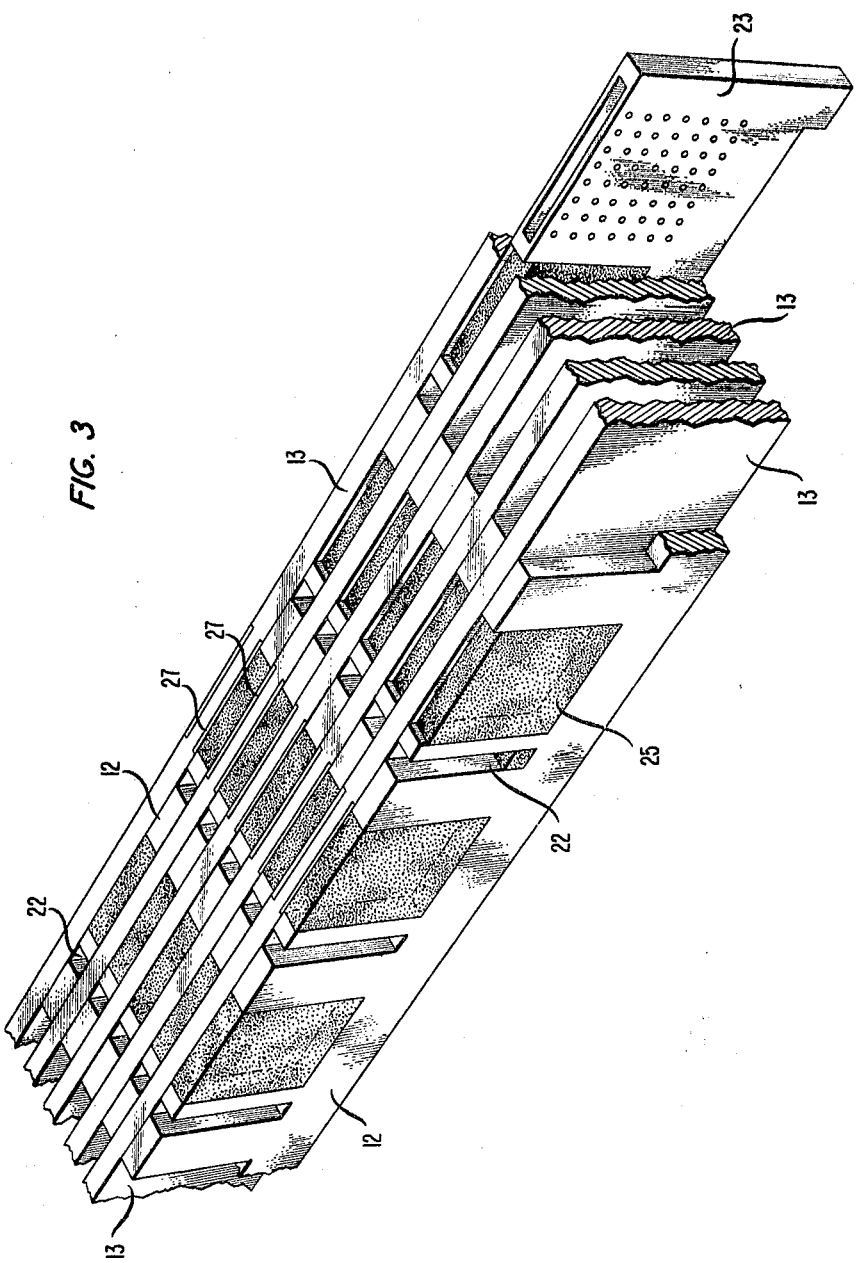
FIG. 3 is a perspective view of a portion of the boat of FIGS. 1 and 2 showing the interleaved slider plates partially in section.
Figure 4:
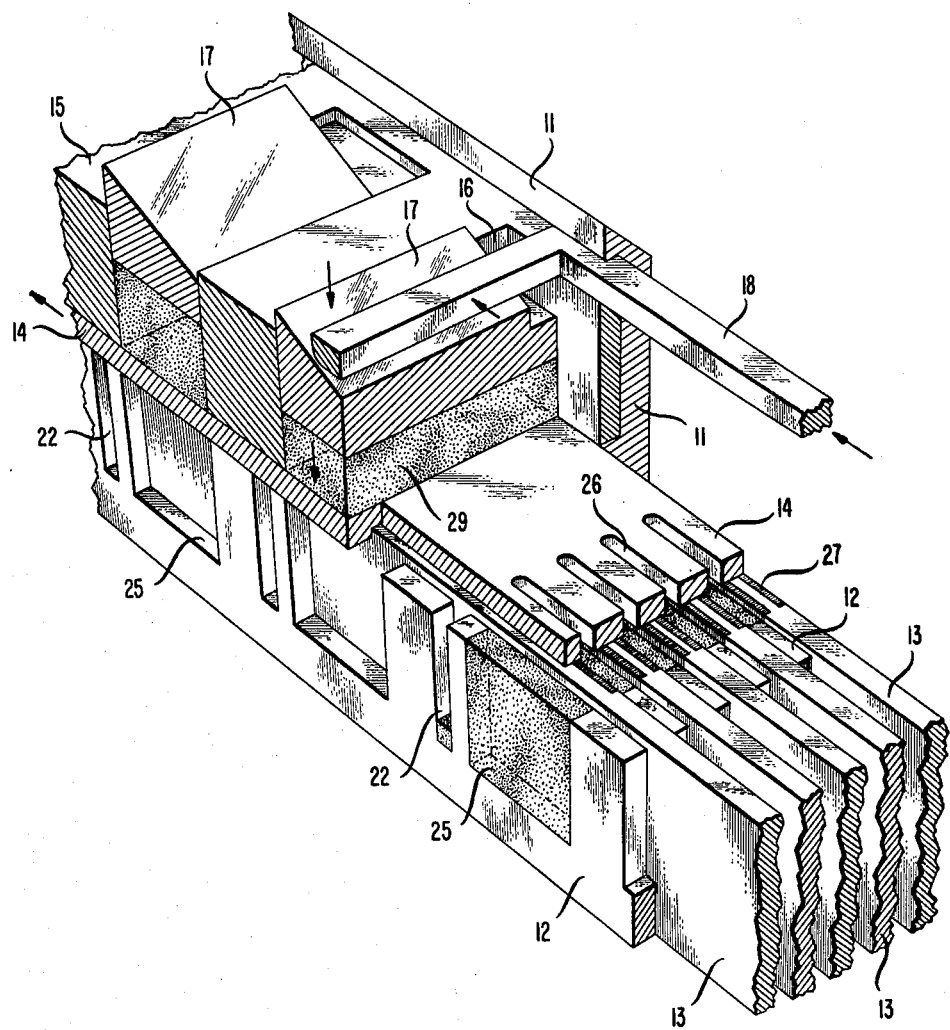
FIG. 4 likewise is a perspective showing in more detail the interleaved slider plates, shutter plate, and melt chambers and pistons in the upper tier of the boat.

The practice of the method of this invention using the above-described apparatus involves first charging the boat 10 both with wafers 27, as shown in FIG. 3 and FIG. 4, and by forming the prescribed growth solutions in each of the melt chambers 16. With respect to the wafers 27, they may be mounted relatively securely by making the melt sections 25 smaller in area than the wafer recesses 24. Typically the wafers are of compound semiconductor single crystal structure, and the growth solutions likewise are compound semiconductor material suitably doped for producing layers of the desired conductivity type for making optoelectronic devices. In particular, the method relates to the fabrication of devices from ternary compounds such as the indium phosphide-indium gallium arsenide families. However, the method is not restricted solely to such compounds but may be advantageously applied to the range of materials for which liquid phase epitaxy is the usual practice. As is known, the growth solutions are arranged so that sequential lowering of the temperature results in epitaxial growth from each separate solution in sequence.

Advantageously, at the start of the process as the boat 10 is raised to an operating temperature of about 700° C., the end chamber 23 in each melt plate 12 comprises a phosphorus source which is provided in close proximity to the wafers to preclude the erosion of phosphorus from the wafers. This is a desirable feature, with those wafers of the III–V phosphide family. The segment 23 of the melt plate as shown in FIG. 3 comprises a well for containing the phosphorus source and an array of small perforations through which the phosphorus can diffuse to ensure a copious supply to prevent undesired erosion. These reservoirs may be used to supply other elements for other compound semiconductor families where the element is subject to erosion because of its high vapor pressure.

After homogenization of the melts at a prescribed temperature for a given time, the shutter plate 14 is advanced to the first set of wells 25 formed in the melt plates 12. This arrangement is shown particularly in FIG. 4, in which the ports 26 in the shutter plate 14 are shown aligned with the underlying wells in the wells 25 in the melt plates 12. Coupled with the advance of the shutter to this position, the push rod 18 forces the piston 17 downward, applying pressure on the melt, thus separating the melt into a series of aliquant portions as defined by each melt well 25 and a remainder portion 29 which remains above the melt plate 15 and beneath the piston 17. It is significant that the aliquant portions in the melt wells are in contact with or communication with the remainder portion 29 through the ports 26 during the growth process.

By providing that a remainder portion 29 of the melt exists, there is enabled the use of a two-phase melt. The melt contains both liquid and some solid material which furnish excess saturating elements to ensure that the composition of the melt remains at the desired limits throughout the temperature cycle. The feature of having the aliquant portions in communication with the remainder portion during the growth step ensures relative uniformity of the various portions of the melt, and thus both features contribute to the fabrication of epitaxial layers which closely meet the specified compositions.

The growth step occurs as a consequence of a temperature change which may be of the order of a degree or even fractions of a degree. The change may be gradual or may be a steep change, with a holding of the temperature at as close to a fixed temperature as possible for the growth period. As shown in FIG. 4, each aliquant portion of the melt, held in the wells 25, provides material to two oppositely facing wafers.

The process continues by substantially repeating the procedure for the next melt in the sequence. To this end, the shutter plate 14 is advanced so as to register the ports 26 beneath the next melt and over the next set of melt wells. As the shutter plate is advanced from the first growth position, any residual quantities of the first melt remaining in the ports are captured in the wiping wells 22 intermediate in the sets of melt wells 25.

Positioning of the ports of the shutter plate beneath the second melt chamber coupled with advance of the push rod 18 produces the separation of the second melt into aliquant portions in the melt wells of the lower tier and a remainder portion under the piston in the upper tier similar to what has been described for the first melt. Following this separation of the second melt into portions, the wafer slider plates 13 are advanced to the second set of melt wells. As the wafers pass the wiping wells 22, any residual material from the first melt and growth step is captured in the wiping wells 22, thus ensuring that the next growth step occurs using only material from the second melt, and there is minimum possibility of cross contamination of the growth melts.

When the wafers have been positioned adjoining the second set of melt wells, the temperature again is changed to induce epitaxial growth of the second layer, and the process is repeated in sequence for each melt provided. In the particular apparatus shown in FIG. 1, if all five melt chambers are used, then a device having five different epitaxial layers will be produced.

What is claimed is:

1. A method for the growth by liquid phase epitaxy of a plurality of crystalline layers, each of a different semiconductor material in succession on a plurality of semconductor wafers comprising (a) forming a plurality of separate compound semiconductor solutions, each corresponding to a layer to be grown, (b) placing the wafers in an apparatus together with, but out of contact with, said solutions, (c) raising the temperature of the apparatus to a first temperature at which said solutions are substantially molten, (d) separating a first one of said solutions into a plurality of aliquant portions and a remainder portion, said aliquant portions being in contact with said remainder portion, (e) placing at least a portion of the face of each wafer in contact with one of said aliquant portions of the first solution, (f) reducing the temperature of the apparatus thereby to grow a first epitaxial layer on said faces of said wafers, (g) separating a second one of said solutions into a plurality of aliquant portions and a remainder portion, said aliquant portions being in contact with said remainder portion, (h) removing all of said wafers from contact with any portion of said first solution, (i) then placing at least a portion of the face of each wafer in contact with one of said aliquant portions of the second solution, and (j) reducing the temperature of the apparatus thereby to grow a second epitaxial layer on said first epitaxial layer.

2. The method in accordance with claim 1 in which the wafers and solutions are of compound semiconductor materials.

3. The method in accordance with claim 1 in which there is one aliquant portion for each pair of wafers.

4. The method in accordance with claim 1 in which the step of separating each solution includes the application of pressure to the solution.

5. The method in accordance with claim 1 in which the step of removing the wafers from all contact with the first solution before making contact with the second solution includes the step of wiping the surface of the newly grown layer on each wafer.

6. The method in accordance with claim 1 in which the wafers are maintained in a vertical disposition throughout the growth process.

7. The method in accordance with claim 2 in which the wafers and solutions are compound semiconductors selected from the group consisting of ternary, quarternary, and multi-element semiconductors.

* * * * *